United States Patent
Nakamura (10) Patent No.: US 7,605,396 B2
(45) Date of Patent: Oct. 20, 2009

(54) FIELD EFFECT TYPE ORGANIC TRANSISTOR AND PROCESS FOR PRODUCTION T HEREOF

(75) Inventor: Shinichi Nakamura, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/273,507

(22) Filed: Nov. 18, 2008

(65) Prior Publication Data

US 2009/0114907 A1 May 7, 2009

Related U.S. Application Data

(62) Division of application No. 10/555,374, filed as application No. PCT/JP2004/013996 on Sep. 16, 2004, now Pat. No. 7,459,721.

(30) Foreign Application Priority Data

Sep. 19, 2003 (JP) .............. 2003-328525

(51) Int. Cl.
*H01L 29/08* (2006.01)
(52) U.S. Cl. .................. 257/40; 257/347; 257/E51.007
(58) Field of Classification Search ............ 257/40, 257/347, E51.007
See application file for complete search history.

(56) References Cited

U.S. PATENT DOCUMENTS

| 5,091,502 A | * | 2/1992 | Narang et al. ........... 528/229 |
| 5,854,139 A | * | 12/1998 | Aratani et al. ........... 438/780 |
| 6,060,581 A | | 5/2000 | Yu et al. |
| 6,692,658 B2 | | 2/2004 | Nakamura et al. |
| 6,794,220 B2 | * | 9/2004 | Hirai et al. ........... 438/99 |
| 6,875,996 B2 | | 4/2005 | Nakamura |
| 6,936,186 B2 | | 8/2005 | Igawa et al. |
| 2006/0234335 A1 | | 10/2006 | Nakamura |
| 2007/0034860 A1 | | 2/2007 | Nakamura |

FOREIGN PATENT DOCUMENTS

| JP | 7-221367 | 8/1995 |
| JP | 10-182821 | 7/1998 |
| JP | 2001-40209 | 2/2001 |
| JP | 3163357 | 3/2001 |
| WO | WO 03/007398 | 1/2003 |

OTHER PUBLICATIONS

Wei-Yang Chou, et al., "An Orientation-Controlled Pentacene Film Aligned by Photoaligned Polyimide for Organic Thin-Film Transistor Applications", Advanced Functional Materials, XP-001201096, vol. 14, No. 8, Aug. 2004, pp. 811-815.

Shu Hotta, et al., "Crystal Structures of Oligothiophenes and Their Relevance to Charge Transport", Advanced Materials, vol. 5, No. 12, 1993, pp. 896-908.

(Continued)

*Primary Examiner*—Leonardo Andújar
(74) *Attorney, Agent, or Firm*—Fitzpatrick, Cella, Harper & Scinto (57) ABSTRACT

A field effect type organic transistor is provided which comprises a source electrode, a drain electrode, and a gate electrode, a gate insulating layer, and an organic semiconductor layer, wherein the gate insulating layer contains an optical anisotropic material having an anisotropic structure formed by light irradiation, and the organic semiconductor layer is in contact with the anisotropic structure.

4 Claims, 1 Drawing Sheet

OTHER PUBLICATIONS

H. Sirringhaus, et al., "Two-dimensional charge transport in self-organized, high-mobility conjugated polymers", Nature, vol. 401, Oct. 14, 1999, pp. 685-688.

M. Koden, et al., "P-77: FLC Materials with Fast Response Time and High Contrast Ratio for the t-Vmin Mode FLCDs", SID International Symposium Digest of Technical Papers, May 1998, pp. 778-781.

* cited by examiner

FIELD EFFECT TYPE ORGANIC TRANSISTOR AND PROCESS FOR PRODUCTION T HEREOF

TECHNICAL FIELD

The present invention relates to a field effect type organic transistor and a process for production thereof. In particular, the present invention relates to a field effect type organic transistor useful in electronic fields such as display devices, information tags, IC, and so forth, and to a process for production thereof.

BACKGROUND ART

Transistors employing an organic semiconductor are being developed actively in competition with silicon transistors based on crystalline silicon technology. The organic semiconductor has features of an organic material such as lightweight, flexibility, variety, and durability, and further has advantages that it can be formed by a low temperature process of about 100° C. and can be produced by a liquid process such as printing and spin coating. Therefore, the organic transistor can be formed on a plastic substrate, or in a larger display screen, which has not been achieved by crystal silicon semiconductors. Therefore the organic transistor is promising in application to novel devices such as flexible electronic paper sheets, and information tags.

A usual organic semiconductor has a carrier mobility on a level of $10^{-4}$ to $10^{-2}$ cm$^2$/Vs, which is lower by one or more decimal digits than in silicon semiconductors. Owing to this high resistance, a large current is not readily obtainable and the operation frequency is lower, disadvantageously. For obtaining higher mobility, it is effective to arrange regularly the organic semiconductor layers to enlarge the overlap of the conjugation planes as large as possible. A simple method for arranging a liquid crystal substance for a display element is a rubbing method. In Patent Literature 1 (shown later), a fluorine type amorphous polymer is laminated to an insulating oxide film, and thereon an organic semiconductor is arranged by rubbing treatment to achieve a mobility of a level of $10^{-3}$ cm$^2$/Vs.

On the other hand, to solve the problem of contamination of impurity caused by the cloth and nonuniformity in the rubbing method, optical orientation is disclosed in which the film is made anisotropic by irradiation with light for orientation. However, the optical orientation is applicable to limited kinds of liquid crystal materials as described in Patent Literature 3.

Generally, in the field effect transistor, the drain current in the saturation area can be derived according to Equation (I) below.

$$Id = \mu(W/2L)Ci(Vg-Vth)^2 \qquad (I)$$

where Id is a drain current (A), $\mu$ is a mobility (cm$^2$/Vs), W is a channel breadth (cm), L is a channel length, Ci is a capacity (F/cm$^2$) of a gate insulating layer, Vg is a gate voltage (V), Vth is a threshold voltage of a transistor. The value of Vth is obtained by extrapolation in the relation of the square root of the drain current and the gate voltage to the drain current Id=0.

In use of the transistor as a switching device, the ratio of the current flowing between a source electrode and a drain electrode in a turned-on state to that in a turned-off state (on-off ratio) should be not less than $10^4$, preferably is not less than $10^6$. However, in organic semiconductors, the ion current is small owing to the low mobility as mentioned above and the off-current is large owing contamination in the organic semiconductors. Therefore, sufficiently high on-off ratio is not obtainable with the organic semiconductors. The field effect type organic transistor employing an organic semiconductor does not satisfy the necessary practical characteristics at the moment.

Patent Literature 1 Japanese Patent Application Laid-Open No. H07-221367
Patent Literature 2 Japanese Patent Application Laid-Open No. H10-182821
Patent Literature 3 Japanese Patent Application Laid-Open No. 2001-40209

DISCLOSURE OF THE INVENTION

The present invention has been achieved on the above technical back ground to solve the above problems, and intends to provide a novel field effect type organic transistor having an organic semiconductor layer giving a high mobility and a high on-off ratio useful in electronic fields for display devices, information tags, and IC.

The present invention intends to provide a field effect type of organic transistor giving an improved mobility and an improved on-off ratio of the organic semiconductor. This field effect type organic transistor is produced by using a gate insulating layer containing an optical anisotropic material and orienting an organic semiconductor material by the optical anisotropic material.

According to an aspect of the present invention, there is provided a field effect type organic transistor comprising a source electrode, a drain electrode, a gate electrode, a gate insulating layer, and an organic semiconductor layer, wherein the gate insulating layer contains an optical anisotropic material having an anisotropic structure formed by light irradiation, and the organic semiconductor layer is provided in contact with the anisotropic structure.

The anisotropic structure is formed preferably by optical isomerization or dimerization.

The optical anisotropic material is preferably an azobenzene compound, a cinnamoyl compound, a coumarine compound, or a chalcone compound.

The organic semiconductor layer is constituted preferably of a conjugated polymer compound.

The conjugated polymer compound has a weight-average molecular weight ranging preferably from 5,000 to 500,000.

According to another aspect of the present invention, there is provided a process for producing a field effect type organic transistor having a source electrode, a drain electrode, a gate electrode, a gate insulating layer, and an organic semiconductor layer, the process comprising the steps of forming the gate insulating layer containing an optical anisotropic material, and forming the organic semiconductor layer in contact with an anisotropic structure formed by irradiation of light to the optical anisotropic material.

The irradiating light is preferably ultraviolet light.
The irradiating light is preferably polarized ultraviolet light.

BEST MODE FOR CARRYING OUT THE INVENTION

The structure of the field effect transistor of the present invention is effective in any of planar types, stagger types, and inverse staggered types. The structure of the field effect type organic transistor of the present invention is explained by taking an example of planar type by reference to FIG. 1.

Figure 1:
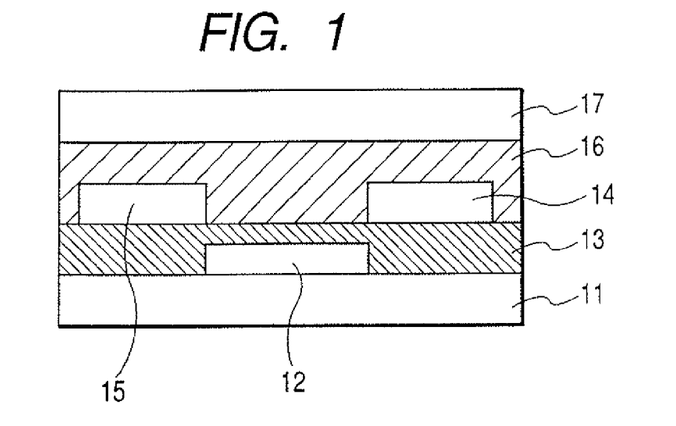
FIG. 1 is a schematic sectional view of a field effect type organic transistor of the present invention.

FIG. 1 is a schematic sectional view of an example of the field effect type organic transistor of the present invention. In FIG. 1, the field effect type organic transistor of the present invention is constituted of an insulating substrate 11, gate electrode 12 thereon, gate insulating layer 13 further thereon, source electrode 15 and drain electrode 14 further thereon, organic semiconductor layer 16 further thereon, and protecting film 17 as the uppermost layer.

The field effect type organic transistor of the present invention contains an optical anisotropic material in the gate insulating layer, and the optical anisotropic material allows the contacting organic semiconductor material to orient. This orientation gives the effects of (1) improvement of the mobility in the organic semiconductor, and (2) improvement of the on-off ratio.

The optical anisotropic material employed in the present invention can be made anisotropic on the surface by action of light, and is capable of orienting the organic semiconductor material in contact therewith.

In an organic semiconductor layer, the direction of movement of the charges is closely related to the conjugation plane of the organic semiconductor material as described in "Nature", vol. 401, 14, 685, 1999. Therefore, for improvement of the mobility in the organic semiconductor layer, it is important not only to uniformize the direction of the organic semiconductor material but also to define the conjugation plane. A rubbing method is known to be the simplest and most effective method for orienting a liquid crystal. The rubbing method is applicable to the organic semiconductor material as disclosed in the aforementioned Japanese Patent Application Laid-Open No. H07-221367. However, this method simply arranges molecules of an organic semiconductor in a direction along grooves, but does not define the conjugation plane for the mobility. On the other hand, the optical anisotropic material has been developed for orienting similarly a liquid crystal material, but can only define to some extent a macroscopic direction of the liquid crystal molecules in molecular movement without defining the arrangement of the structure of the molecules.

In the present invention, it was found that an optical anisotropic material, when used for orienting an organic semiconductor material, is capable of defining the microscopic arrangement of the structure. This effect cannot be obtained with a liquid crystal material. The advantages of the present invention are as follows: (1) an organic semiconductor material can be arranged microscopically to define the conjugation plane by utilizing the interaction between the optical anisotropic material and the organic semiconductor material in a micro region, enabling definition of a conjugation plane; (2) the interface between the insulating layer and an organic semiconductor layer can be formed with less irregularity of the orientation and with high flatness; (3) The off-state current can be minimized owing to a less amount of contaminating dust and impurities; and so forth.

The optical anisotropic material employed in the present invention is not limited, provided that the material is capable of causing anisotropy on the surface thereof to orient a contacting organic semiconductor layer. The anisotropy-forming processes are classified roughly into two types: a photoisomerization type, and a photoreaction type. The photoreaction type is further classified into a dimerization type, a decomposition type, a combination type, and a decomposition-bridging type. Not to contaminate the organic semiconductor layer, the processes are preferred which do not leave impurity ions, radicals, or the like after the light irradiation. Accordingly, the photoisomerization type and the dimerization type are preferred.

The photoisomerization type process utilizes an isomerization reaction typified by cis-trans isomerization. Preferred materials are exemplified by azobenzene compounds. The azobenzenes rearrange from a trans form to a cis form by light irradiation of a wavelength of 365 nm, and rearrange from a cis form to a trans form by light irradiation of the wavelength of 436 nm reversibly. The dimerization type process utilizes preferably cinnamoyl compounds, coumarine compounds, and chalcone compounds.

Specific examples of the optical anisotropic material employed in the present invention are enumerated below without limiting the invention. In the structural formulas below, R represents H, a halogen, CN, $CF_3$, or an alkyl or perfluoroalkyl group of 1 to 20 carbon atoms: in the alkyl, one or more of methylene groups may be replaced by O, CO, NH, or S. X represents an alkylene group of 1 to 20 carbon atoms: in the alkylene, one or more of methylene groups may be replaced by O, CO, NH, or S. A represents —CH—$CH_2$—, —C($CH_3$)—$CH_2$—, or —SiZ-O—: Z representing an alkyl or alkoxy group of 1 to 20 carbons. The symbol n represents an integer showing a polymer, ranging from 10 to 100,000 corresponding to a number-average polymerization degree.

(H-1)

(H-2)

(H-3)

(H-4)

The gate insulating layer containing the optical anisotropic material of the present invention can be comprised of an optical anisotropic material by a process of casting, spin coating, immersion coating, screen printing, micromolding, microcontacting, roll coating, ink-jetting, LB forming, or the like.

The gate insulating layer of the present invention may be constituted of one or more layers, and may be composed of combination of the optical anisotropic material and another additional material. The additional material includes inorganic materials such as $SiO_2$, SiN, $Al_2O_3$, and $Ta_2O_5$; organic materials such as polyimides, polyacrylonitrile, polytetrafluoroethylene, polyvinyl alcohol, polyvinylphenol, polyethylene terephthalate, and polyvinylidene fluoride; and organic-inorganic hybrid materials, but is not limited thereto. Of the materials, organic compounds are preferred because of possibility of working by a low-cost liquid process.

The process for producing the field effect type organic transistor of the present invention comprises a step of forming a gate insulating layer containing an optical anisotropic material; a step of irradiating the optical anisotropic material with light to give anisotropy to the surface of the optical anisotropic material and to give it capability to orient an organic semiconductor material in contact with the gate insulating layer; and a step of orienting the organic semiconductor layer by utilizing the orientation-controlling capability of the optical anisotropic material.

In the production process of the present invention, the light for irradiation of the optical anisotropic material includes visible light, ultraviolet light, and the like. Of these, ultraviolet light is preferred, and polarized light such as linearly polarized light and elliptically polarized light is preferred. The polarized light can be obtained by passing the light generated by a high-pressure mercury lamp, a metal halide lamp, a xenon lamp, or the like through a polarizing filter or a polarizing prism. The quantity of the light energy ranges preferably from 0.1 to 10 J/cm$^2$.

The material of the organic semiconductor layer in the present invention may be any conjugated compounds having a conjugated double bond without limitation. The preferred compounds therefor include:

conjugated polymer compounds such as polyacetylene derivatives, polythiophene derivatives having a thiophene ring, poly(3-alkylthiophene) derivatives, poly(3,4-ethylenedioxythiophene) derivatives, polythienylene-vinylene derivatives, polyphenylene derivatives having a benzene ring, polyphenylene-vinylene derivatives, polypyridine derivatives having a nitrogen atom, polypyrrole derivatives, polyaniline derivatives, and polyquinoline derivatives; oligomers such as dimethylsexithiophene, and quaterthiophene;

acenes such as perylene, tetracene, and pentacene; deposited organic molecules such as copper phthalocyanine derivatives; discotic liquid crystals such as triphenylene derivatives; smectic liquid crystals such as phenylnaphthalene derivatives and benzothiazole derivatives; and liquid crystal polymers such as poly(9,9-dialkylfluorene-bithiophene) copolymer; but are not limited thereto.

Of the above compounds, preferred are polymer compounds having the conjugation structure for production by a liquid phase process. The polymer compounds include compounds having the structures shown below.

-continued (In the formulas, $R_1$, $R_2$, $R_3$, and $R_4$ represent respectively H, F, or an alkyl or alkoxy group of 1 to 20 carbon atoms; and n represents a positive integer.)

The molecular weight of the above conjugated polymer compounds is not limited, but preferably the weight-average molecular weight ranges from 5,000 to 500,000 in view of the solubility in a solvent and the film-forming properties.

The organic semiconductor layer in the present invention may contain a suitable dopant for adjusting the electronic conductivity. The dopant includes acceptor type dopants such as $I_2$, $Br_2$, $Cl_2$, ICl, $BF_3$, PF5, $H_2SO_4$, $FeCl_3$, TCNQ (tetracyanoquinodimethane); donor type dopants such as Li, K, Na, and Eu; and surfactants such as alkylsulfonic acid salts, and alkylbenzenesulfonic acid salts.

The insulating substrate is not limited in the constituting material. The material includes inorganic material such as glass, and quartz; photosensitive polymer compounds such as polymers of acryl types, vinyl types, ester types, imide types, urethane types, diazo types, and cinnamoyl types; organic materials such as polyvinylidene fluoride, polyethylene terephthalate, and polyethylene; and organic-inorganic hybrid materials. These materials may be laminated in two or more layers to increase the dielectric strength effectively.

The materials for the gate electrode, the source electrode, and the drain electrodes in the present invention are not limited, provided that the material is electroconductive. The materials include metal materials such as Al, Cu, Ti, Au, Pt, Ag, and Cr; inorganic materials such as polysilicon, silicides, ITO (indium tin oxide), and $SnO_2$; electroconductive polymer such as polypyridine, polyacetylene, polyaniline, polypyrrole, and polythiophene which are highly doped; electroconductive inks containing carbon particles, silver particles and the like. In particular, for use for flexible electronic paper sheets, or the like, preferably each of the electrodes are comprised of an electroconductive polymer, electroconductive inks containing carbon or silver particles dispersed therein, or the like in order to make uniform the thermal expansions with the substrate.

The processes for forming the respective members of the electrodes, the gate insulating layer, and the organic semiconductor layer are not limited. In the case where an organic material is used, the member can be formed by electrolytic polymerization, casting, spin coating, immersion coating, screen printing, micro-molding, micro-contacting, roll coating, ink-jetting, LB forming, or the like. Depending on the kind of the material used, vacuum vapor deposition, CVD, electron beam deposition, resistance-heating vapor deposition, or sputtering is effective.

The above members can be patterned in an intended shape by photolithography and etching treatment. Otherwise, soft lithography and ink-jetting are also effective in the patterning. Additionally, a drawing-out electrode, or a protection film may be formed, as necessary.

The present invention provides a field effect type of organic transistor giving an improved mobility and an improved on-off ratio of the organic semiconductor. The improvement is achieved by using a gate insulating layer containing an optical anisotropic material, and orienting the organic semiconductor material by the optical anisotropic material. The field effect type organic transistor is useful in electronic fields such as display devices, information tags, IC, and so forth, and a process for production thereof.

EXAMPLE 1

The present invention is explained below in more detail by reference to examples without limiting the invention.

Figure 2:
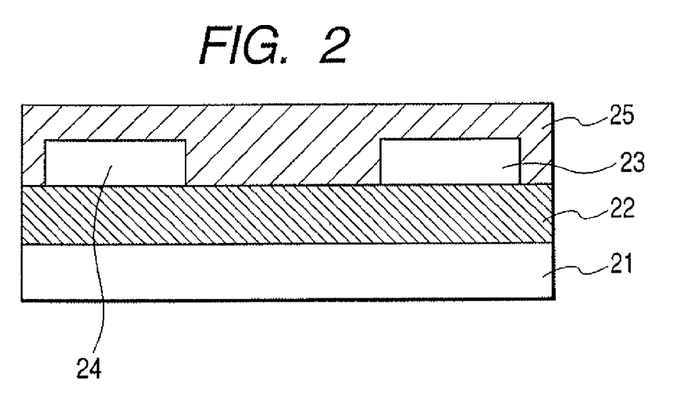
FIG. 2 is a schematic sectional view of a field effect type organic transistor employed in Example of the present invention.

FIG. 2 is a schematic sectional view of the field effect type organic transistor employed in the example of the present invention. Gate electrode 21 was a highly doped n-type silicon substrate. Source electrode 23 and drain electrode 24 were comprised of gold. Organic semiconductor layer 25 was comprised of copper phthalocyanine shown by the formula below.

Gate insulating layer 22 was comprised of azobenzene compound A shown below, (A)

The azobenzene compound A was synthesized according to the method described in Japanese Patent No. 3163357. The obtained azobenzene compound A had a weight-average molecular weight of $5.5 \times 10^5$, and a Tg of 106° C.

The field effect type organic transistor was prepared through the steps below. A solution of azobenzene compound A in toluene (0.1 g/mL) was applied on a silicon substrate by spin coating, and dried at 80° C. for 6 hours. The resulting thin film was heated to 120° C., and cooled to room temperature. The thin film was irradiated with light of wavelength 436 nm in an irradiation energy quantity of 10 J/cm², and then with polarized light of wavelength 365 nm in an irradiation energy quantity of 1 J/cm². Thereon, gold (50 nm) was vacuum-deposited to form both the source electrode and the drain electrode having respectively a channel length of 20 μm and a channel width of 50 mm. The both electrodes are formed so as to allow the charges to flow in the direction parallel to the polarization direction of the irradiating light. Thereon, an organic semiconductor layer was formed by depositing copper phthalocyanine at a pressure of $4 \times 10^{-6}$ torr from a sublimation metal boat placed 10 cm apart from the objective substrate at an average deposition rate of 0.1 nm/s at a substrate temperature of 120° C. to a deposition film thickness of 100 nm. Further, each of the gate electrode, the drain electrode, and the source electrode were wired by gold streaks of 0.1 mm diameter by silver paste. Thus the field effect type organic transistor was completed.

The orientation of the organic semiconductor layer was confirmed by examination by polarization microscopy.

Next, the drain current was measured at the gate electrode ranging from 0 to −50 V and the voltage between the source electrode and the drain electrode ranging from 0 to −50 V. The mobility p was calculated according to Formula (I) shown before. The on-off ratio was derived by applying voltage of −30 V between the source electrode and the drain electrode and taking the ratio of the drain current at the gate voltage Vg=−30 V to the drain current at the gate voltage Vg=0. The results are shown below.

Mobility $\mu = 9.2 \times 10^{-3}$ cm²/Vs

On-off ratio=$10^6$

COMPARATIVE EXAMPLE 1

A field effect type organic transistor was prepared in the same manner as in Example 1 except that the light was not applied in formation of the gate insulating layer.

The orientation of the organic semiconductor layer was examined by polarization microscopy, and found to be random. The evaluation was conducted in the same manner as in Example 1. The mobility and the on-off ratio are shown below.

Mobility $\mu = 8.9 \times 10^{-5}$ cm²/Vs

On-off ratio=$10^4$

EXAMPLE 2

Figure 3:
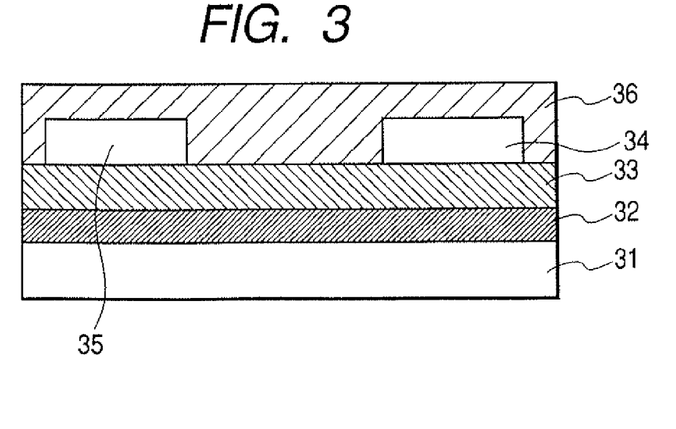
FIG. 3 is a schematic sectional view of another field effect type organic transistor employed in Example of the present invention.

FIG. 3 is a schematic sectional view of the field effect type organic transistor employed in the example of the present invention. Gate electrode 31 was a highly doped n-type silicon substrate, gate insulating layer 32 was comprised of $SiO_2$, source electrode 34 and drain electrode 35 were comprised of gold, and organic semiconductor layer 36 was comprised of dimethylsexithiophene shown by the formula below.

The dimethylsexithiophene was synthesized according to the method described in "Advanced Materials", 5, 896, 1993.

Gate insulating layer 33 was comprised of cinnamoyl compound B shown below.

The cinnamoyl compound B was synthesized according to the synthesis method described in "SID'98, Digest", 780, 1998.

The field effect type organic transistor was prepared through the steps below. A thermal oxidation film $SiO_2$ (300 nm) was formed on a silicon substrate. The surface thereof was treated with 3-aminopropyltriethoxysilane, and cinnamoyl chloride was allowed to react therewith to form the cinnamoyl compound B. The film was irradiated with polarized light of wavelength 365 nm in an irradiation energy quantity of 1 $J/cm^2$. Thereon, gold (50 nm) was vacuum-deposited to form both the source electrode and the drain electrode having respectively a channel length of 20 μm and a channel width of 50 mm. The both electrodes are formed so as to allow the charges to flow in the direction parallel to the polarization direction of the irradiating light. Thereon, an organic semiconductor layer was formed by depositing dimethylsexithiophene at a pressure of $5\times10^{-6}$ torr from a sublimation metal boat placed 10 cm apart from the objective substrate at an average deposition rate of 0.05 nm/s at a substrate temperature of 25° C. to a deposition film thickness of 100 nm. Further, the gate electrode, the drain electrode, and the source electrode were wired by gold streaks of 0.1 mm diameter by silver paste. Thus the field effect type organic transistor was completed.

The orientation of the organic semiconductor layer was confirmed by examination by polarization microscopy.

The evaluation was made in the same manner as in Example 1, and the mobility and the on-off ratio were calculated. The results are shown below.

Mobility $\mu=8.3\times10^{-2}$ $cm^2/Vs$
On-off ratio=$10^7$

COMPARATIVE EXAMPLE 2

A field effect type organic transistor was prepared in the same manner as in Example 2 except that the light was not applied in formation of the gate insulating layer.

The orientation of the organic semiconductor layer was examined by polarization microscopy, and found to be random. The evaluation was made in the same manner as in Example 1, and the mobility and the on-off ratio were calculated. The results are shown below.

Mobility $\mu=4.2\times10^{-4}$ $cm^2/Vs$
On-off ratio=$10^5$

EXAMPLE 3

FIG. 2 is a schematic sectional view of the field effect type organic transistor employed in the example of the present invention. Gate electrode 21 was a highly doped n-type silicon substrate, source electrode 23 and drain electrode 24 were comprised of gold, and organic semiconductor layer 25 was comprised of pentacene shown by the formula below.

Gate insulating layer 22 was comprised of a coumarine compound C shown below.

The coumarine compound C had a weight-average molecular weight of $7.3 \times 10^4$, and a Tg of 91° C.

The field effect type organic transistor was prepared through the steps below. A solution of coumarine compound C in chloroform (0.1 g/mL) was applied on a silicon substrate by spin coating, and dried at 80° C. for 6 hours. The resulting thin film was heated to 120° C., and cooled to room temperature. The thin film was irradiated with polarized light of wavelength 365 nm in an irradiation energy quantity of 10 J/cm². Thereon gold (50 nm) was vacuum-deposited to form both the source electrode and the drain electrode having respectively a channel length of 20 μm and a channel width of 50 mm. The both electrodes are formed so as to allow the charges to flow in the direction parallel to the polarization direction of the irradiating light. Thereon, an organic semiconductor layer was formed by depositing pentacene at a pressure of $6 \times 10^{-6}$ torr from a sublimation metal boat placed 10 cm apart from the objective substrate at an average deposition rate of 0.1 nm/s at a substrate temperature of 25° C. to a deposition film thickness of 100 nm. Further, the gate electrode, the drain electrode, and the source electrode were wired by gold streaks of 0.1 mm diameter by silver paste. Thus the field effect type organic transistor was completed.

The orientation of the organic semiconductor layer was confirmed by examination by polarization microscopy.

The evaluation was made in the same manner as in Example 1, and the mobility and the on-off ratio were calculated. The results are shown below.

Mobility $\mu = 6.3 \times 10^{-1}$ cm²/Vs

On-off ratio=$10^8$

EXAMPLE 4

FIG. 2 is a schematic sectional view of the field effect type organic transistor employed in the example of the present invention. Gate electrode 21 was a highly doped n-type silicon substrate, source electrode 23 and drain electrode 24 were comprised of gold, and organic semiconductor layer 25 was comprised of copper phthalocyanine. Gate insulating layer 22 was comprised of a chalcone compound D shown below.

The chalcone compound D had a weight-average molecular weight of $6.1 \times 10^5$, and a Tg of 81° C.

The field effect type organic transistor was prepared through the steps below. A solution of chalcone compound D in chloroform (0.1 g/mL) was applied on a silicon substrate by spin coating, and dried at 60° C. for 6 hours. The resulting thin film was heated to 120° C., and cooled to room temperature. The thin film was irradiated with polarized light of wavelength 365 nm in an irradiation energy quantity of 10 J/cm². Thereon gold (50 nm) was vacuum-deposited to form both the source electrode and the drain electrode having respectively a channel length of 20 μm and a channel width of 50 mm. The both electrodes are formed so as to allow the charges to flow in the direction parallel to the polarization direction of the irradiating light. Thereon, an organic semiconductor layer was formed by depositing copper phthalocyanine at a pressure of $4\times10^{-6}$ torr from a sublimation metal boat placed 10 cm apart from the objective substrate at an average deposition rate of 0.1 nm/s at a substrate temperature of 120° C. to a deposition film thickness of 100 nm. Further, the gate electrode, the drain electrode, and the source electrode were wired by gold streaks of 0.1 mm diameter by silver paste. Thus the field effect type organic transistor was completed.

The orientation of the organic semiconductor layer was confirmed by examination by polarization microscopy.

The evaluation was made in the same manner as in Example 1, and the mobility and the on-off ratio were calculated. The results are shown below.

Mobility $\mu=1.1\times10^{-2}$ cm$^2$/Vs

On-off ratio=$10^6$

EXAMPLE 5

FIG. 3 is a schematic sectional view of the field effect type organic transistor employed in the example of the present invention. Gate electrode 31 was a highly doped n-type silicon substrate, gate insulating layer 32 was comprised of SiO$_2$, source electrode 34 and drain electrode 35 were comprised of gold, and organic semiconductor layer 36 was comprised of stereotactic poly-3-hexylthiophene shown by the formula below.

Gate insulating layer 33 was comprised of cinnamoyl compound B.

The field effect type organic transistor was prepared through the steps below. A thermal oxidation film SiO$_2$ (300 nm) was formed on a silicon substrate. The surface thereof was treated with 3-aminopropyltriethoxysilane, and cinnamoyl chloride was allowed to react to form the cinnamoyl compound B. The film was irradiated with polarized light of wavelength 365 nm in an irradiation energy quantity of 1 J/cm$^2$. Thereon, gold (50 nm) was vacuum-deposited to form both the source electrode and the drain electrode having respectively a channel length of 20 μm and a channel width of 50 mm. The both electrodes are formed so as to allow the charges to flow in the direction parallel to the polarization direction of the irradiating light. Thereon, an organic semiconductor layer was formed by applying a solution of stereotactic poly-3-hexylthiophene in chloroform (0.01 g/mL) by spin-coating. The gate electrode, the drain electrode, and the source electrode were wired by gold streaks of 0.1 mm diameter by silver paste. Thus the field effect type organic transistor was completed.

The orientation of the organic semiconductor layer was confirmed by examination by polarization microscopy.

The evaluation was made in the same manner as in Example 1, and the mobility and the on-off ratio were calculated. The results are shown below.

Mobility $\mu=4.7\times10^2$ cm$^2$/Vs

On-off ratio=$10^6$

COMPARATIVE EXAMPLE 3

A field effect type organic transistor was prepared in the same manner as in Example 5 except that the light was not applied in formation of the gate insulating layer. The evaluation was made in the same manner as in Example 1, and the mobility and the on-off ratio were calculated. The results are shown below.

Mobility $\mu=7.6\times10^{-4}$ cm$^2$/Vs

On-off ratio=$10^3$

EXAMPLE 6

FIG. 3 is a schematic sectional view of the field effect type organic transistor employed in the example of the present invention. Gate electrode 31 was a highly doped n-type silicon substrate, gate insulating layer 32 was comprised of SiO$_2$, source electrode 34 and drain electrode 35 were comprised of gold, and organic semiconductor layer 36 was comprised of poly-3,4-ethylenedioxythiophene shown by the formula below.

Gate insulating layer 33 was comprised of cinnamoyl compound B.

The field effect type organic transistor was prepared through the steps below. A thermal oxidation film SiO$_2$ (300 nm) was formed on a silicon substrate. The surface thereof was treated with 3-aminopropyltriethoxysilane, and cinnamoyl chloride was allowed to react therewith to form the cinnamoyl compound B. The film was irradiated with polarized light of wavelength 365 nm in an irradiation energy quantity of 1 J/cm$^2$. Thereon, gold (50 nm) was vacuum-deposited to form both the source electrode and the drain electrode having respectively a channel length of 20 μm and a channel width of 50 mm. The both electrodes are formed so as to allow the charges to flow in the direction parallel to the polarization direction of the irradiating light. Thereon, an organic semiconductor layer was formed by applying a solution of poly-3,4-ethylenedioxythiophene in tetrahydrofuran (0.01 g/mL) by spin-coating. The gate electrode, the drain electrode, and the source electrode were wired by gold streaks of 0.1 mm diameter by silver paste. Thus the field effect type organic transistor was completed.

The orientation of the organic semiconductor layer was confirmed by examination by polarization microscopy.

The evaluation was made in the same manner as in Example 1, and the mobility and the on-off ratio were calculated. The results are shown below.

Mobility $\mu=9.8\times10^{-2}$ cm$^2$/Vs

On-off ratio=$10^7$

This application claims priority from Japanese Patent Application No. 2003-328525 filed on Sep. 19, 2003, which is hereby incorporated by reference herein.

The invention claimed is:

1. A field effect type organic transistor comprising a source electrode, a drain electrode, a gate electrode, a gate insulating layer, and an organic semiconductor layer, wherein a surface portion of the gate insulating layer being in contact with the organic semiconductor layer is anisotropic, and the gate insulating layer is comprised of any one compound selected from the group consisting of:

(I)

(II)

(III) and (IV)

wherein R represents H, a halogen, CN, CF$_3$, or an alkyl or perfluoroalkyl group of 1 to 20 carbon atoms, where in the alkyl, one or more of methylene groups may be replaced by O, CO, NH, or S; X represents an alkylene group of 1 to 20 carbon atoms, where in the alkylene, one or more of methylene groups may be replaced by O, CO, NH, or S; A represents —CH—CH$_2$—, —C(CH$_3$)—CH$_2$—, or —SiZ-O—, with Z representing an alkyl or alkoxy group of 1 to 20 carbons; and the symbol n represents an integer showing a polymer, ranging from 10 to 100,000 corresponding to a number-average polymerization degree.

2. The field effect type organic transistor according to claim 1, wherein the surface portion of the gate insulating layer being in contact with the organic semiconductor layer is comprised of a compound represented by general formula (I), and the compound represented by general formula (I) is represented by general formula (I):

(i)

3. The field effect type organic transistor according to claim 1, wherein the surface portion of the gate insulating layer being in contact with the organic semiconductor layer is comprised of a compound represented by general formula (III), and the compound represented by general formula (III) is represented by general formula (ii):

(ii)

4. The field effect type organic transistor according to claim 1, wherein the surface portion of the gate insulating layer being in contact with the organic semiconductor layer is comprised of a compound represented by general formula (II), and the compound represented by general formula (II) is represented by general formula (iii):

(iii)

* * * * *